United States Patent [19]

Hug

[11] Patent Number: 4,479,298
[45] Date of Patent: Oct. 30, 1984

[54] ALIGNMENT APPARATUS AND METHOD FOR MOUNTING LSI AND VLSI PACKAGES TO A PRINTED CIRCUIT BOARD

[75] Inventor: Paul Hug, Santa Clara County, Calif.

[73] Assignee: Storage Technology Partners, Louisville, Colo.

[21] Appl. No.: 517,481

[22] Filed: Jul. 26, 1983

[51] Int. Cl.³ .............................................. H01L 21/60
[52] U.S. Cl. ........................................ 29/589; 357/70; 29/827; 29/759; 228/4.1; 228/6 A; 228/179
[58] Field of Search ...................... 29/571, 576 R, 589, 29/590, 591, 827, 739, 743, 759; 357/70; 228/4.1, 4.5, 6 A, 180 R, 179, 49 R, 44.1 A, 105

[56] References Cited

U.S. PATENT DOCUMENTS

| | | | |
|---|---|---|---|
| 3,469,684 | 9/1969 | Keady et al. | 29/827 X |
| 4,010,885 | 3/1977 | Keizer et al. | 228/105 X |
| 4,116,376 | 9/1978 | Delorme et al. | 29/827 X |
| 4,224,637 | 9/1980 | Hargis | 357/70 X |

Primary Examiner—Brian E. Hearn
Assistant Examiner—David A. Hey
Attorney, Agent, or Firm—Bryant R. Gold

[57] ABSTRACT

An apparatus for aligning the leads of an integrated circuit (IC) package with respect to the pads of the printed circuit board to which they will be bonded is presented. An alignment fixture, comprising a coarse alignment pedestal mounted on a fine alignment block, receives the IC package on the alignment fixture and aligns the leads with respect to a reference coordinate system of the alignment fixture. A vacuum chuck is lowered to contact the aligned package, and is then raised to lift the aligned package off the fine alignment block while holding it in the aligned position. An X-Y table positions the printed circuit board under the aligned package. The vacuum chuck lowers the aligned package until the leads contact the pads, and holds it while the leads are bonded to the pads.

7 Claims, 5 Drawing Figures

ALIGNMENT APPARATUS AND METHOD FOR MOUNTING LSI AND VLSI PACKAGES TO A PRINTED CIRCUIT BOARD

BACKGROUND OF THE INVENTION

This invention relates to an apparatus and method for aligning an integrated circuit (IC) package in preparation for soldering it to the second level of packaging, e.g., a printed circuit board. More particularly, it relates to an apparatus and method that aligns the leads of the IC package with the pads of the second level package and maintains this alignment while the leads of the IC package are bonded to the desired pads.

Electronic products that utilize IC's typically comprise several levels of packaging. The first level of packaging is the IC package which contains the IC chip itself and has leads (also called legs or pins) that allow it to be both electrically and mechanically connected to the next level of packaging. Fine wires are used within the package to connect the signal pads of the chip to the leads of the package.

The second level of packaging provides a means of interconnecting the IC's. Traditionally, epoxy-fiberglass printed circuit boards, quite often with multiple layers of wiring, have been used for this purpose. The IC package is attached, by a variety of means, to the printed circuit board to make an electrical connection between the leads of the package and the wiring of the board and, at the same time, mechanically attach it to the second level package.

Small scale integration (SSI) and medium scale integration (MSI) IC's are typically packaged in dual-inline packages (DIP's). These packages are rectangular in shape and have a relatively small number of leads. Typical totals are 14 or 16, while a few DIPs have as many as 40 leads. The leads are usually spaced a tenth of an inch apart, with half of the total leads being placed along each long dimension of the DIP. DIP's are normally attached to the printed circuit board by inserting their leads in through-plated-holes provided on the board and soldering them in place. They can be readily removed for replacement by melting and removing the solder from the holes. Techniques for doing this are well understood in the art.

When integrated circuit technology improved to large scale integration (LSI) and very large scale integration (VLSI), the number of input/output signals of the chips increased dramatically. For example, VLSI packages with 256 leads are now being used. Since the object of LSI and VLSI is to increase the density of circuits at all levels of packaging, the leads of the LSI and VLSI IC packages are made smaller in width and placed closer together than those of the DIP's.

The typical LSI or VLSI package is square with an equal number of leads on each side. Because the leads are so small and so close together, e.g., leads 0.010 inches wide with 0.010 inch spaces between them are not uncommon, it is impractical to provide through-plated-holes of similar dimensions. Even if through-plated-holes could be fabricated with those dimensions, it would be difficult to insert all the leads into all the holes simultaneously without causing damage to the leads. Once the leads were soldered in the holes, it would be very difficult to unsolder all of them without causing damage to the board if the IC package had to be replaced.

LSI and VLSI IC packages are typically attached to the printed circuit board by lap soldering the leads to pads, arranged in the same pattern as the leads, on the surface of the board. To accommodate this, the leads of an LSI or VLSI package typically radiate outward, parallel with the top and bottom surface of the package, but positioned beneath the bottom surface.

Because of the number of leads and their smallness, it is desirable in a manufacturing process to bond them to the pads of the board using automated or semi-automated techniques. (The actual bonding process used—for example, thermo-compression bonding, laser beam bonding, lap soldering, etc.—is immaterial to this invention.) However, before this automated or semi-automated process can begin, all the leads of the package must be aligned with all of the corresponding pads of the printed circuit board.

Disadvantageously, there is an inherent problem in LSI and VLSI packages which in the prior art, has required that the alignment of the leads of the package with the pads of the printed circuit board be done manually. Once this alignment is performed and the package is held in place, the automated or semi-automated bonding can take place.

Both the pads on the printed circuit board and the leads of the IC package are formed by an etching process. The pattern to be etched is first formed on film and then transferred to the board, or metal from which the leads will be made. The pattern on the film can be made with high accuracy, e.g., to tolerances of 0.001 inch and better, using automated photo-plotters. The end result is that the pads on the printed circuit board are precisely located with respect to each other, as are the leads of the IC package.

When the leads are attached to the package, they maintain their precise location with respect to each other. Unfortunately, however, because of the assembly process, the position of the leads with respect to the corners of the package may vary, from package to package, on the order of 0.01 inch.

In the past, attempts to automatically align the leads of the package to the pads of the printed circuit board have used the package as the reference for alignment. Since the leads have a potential error in placement with respect to the package, they also have a potential error in placement with respect to the pads. Hence, the common technique used in the prior art to align the leads to the pads is to place the package on the pads so that the leads are approximately aligned with the pads. This is done by some automated process or manually by an operator. The operator, using a microscope, then moves the package to obtain the "best" fit between the pads and the leads. The operator then causes a number of leads to be bonded to their respective pads, typically one near each corner of the package, to hold the package in place during the semi-automated or automated bonding process which follows.

The process of the prior art has several disadvantages, including: (1) it takes time, and in any manufacturing process, it is desirable to reduce time, and thereby, reduce costs; (2) the operator, being human, is subject to making errors in the alignment, thereby creating the possibility of having leads touching adjacent pads and causing electrical shorts; and (3) after aligning the leads and during the bonding of several leads to hold the package in place, the package can be inadvertently moved enough to cause electrical shorts.

Thus, it is apparent from the above discussion that a need exists in the art for an apparatus and method to align the leads of a VLSI or LSI chip package to the pads of the printed circuit board to which the package is to be bonded. Such an apparatus and method would not only lower the manufacturing cost (by reducing the manufacturing time), but would also improve the quality of the second level package.

SUMMARY OF THE INVENTION

A primary object of the present invention is to provide a method and apparatus to align the leads of an IC package with respect to the pads of the printed circuit board to which the leads will be bonded.

Another object of the invention is to provide such a method and apparatus that is compatible with automatic or semi-automatic manufacturing processes.

A further object of the invention is to provide such a method and apparatus that maintains the desired aligned position between the IC leads and board pads throughout the manufacturing process, including placing the IC package on the printed circuit board and bonding the IC leads to the board pads.

The above and other objects of the present invention are realized through the use of an alignment fixture comprising: (1) a coarse alignment pedestal and a fine alignment block for precisely aligning the IC leads (not the IC package) in a desired coordinate system; (2) a vacuum chuck mechanism, which can selectively attach to the IC package, for raising and lowering the IC package while still maintaining the lead in the desired alignment; and (3) an X-Y positioning mechanism, also aligned in the desired coordinate system, for selectively positioning the printed circuit board, as the IC package, with its pre-aligned leads, is lowered thereon by the vacuum chuck mechanism.

In one embodiment, the coarse alignment pedestal is a raised block, the same shape as the IC package, with slightly smaller dimensions. The leads of the IC package extend a slight amount beyond the bottom surface of the package. When the bottom surface of the package is placed on the pedestal, the leads of the package are coarsely aligned with respect to the pedestal as they fit therearound. The coarse alignment pedestal is mounted on a fine alignment block. The fine alignment block has a multiplicity of slots machined in its surface that are precisely aligned with the coordinate system of the alignment fixture. The slots are machined in the same pattern as leads on the IC package and are slightly wider than the leads. After the coarse alignment, a slight movement in the appropriate direction, if necessary, by an operator or other source will cause each lead to drop into its corresponding slot. This precisely aligns the leads of the package with respect to the coordinate system of the alignment fixture.

When the fine alignment is achieved, a vacuum chuck is lowered until it touches the top surface of the package. The source of vacuum used is sufficient to hold the weight of the package, but not enough to disturb the alignment of the package leads while engaging. The vacuum chuck is then raised to lift the IC package from the fine alignment pedestal.

The X-Y positioning mechanism, which holds the printed circuit board in desired coordinate system, is then moved to position the pads to which the IC package is to be bonded under the vacuum chuck. The vacuum chuck is then lowered to place the aligned leads of the IC package on the pads of the printed circuit board. The vacuum chuck also holds the IC package, and its aligned leads, in place while the bonding of the leads to their respective pads takes place.

BRIEF DESCRIPTION OF THE DRAWINGS

The above, and other objects, features, and advantages, of the present invention may be best understood by reference to the following detailed description of the invention presented in conjunction with the accompanying drawings wherein.

DETAILED DESCRIPTION OF THE INVENTION

The following is a description of the best presently contemplated mode of carrying out the present invention. This description is given only to illustrate the general principles of the invention and is not to be taken in a limiting sense. To ascertain the true scope of the invention, reference should be made to the appended claims.

Figure 1:
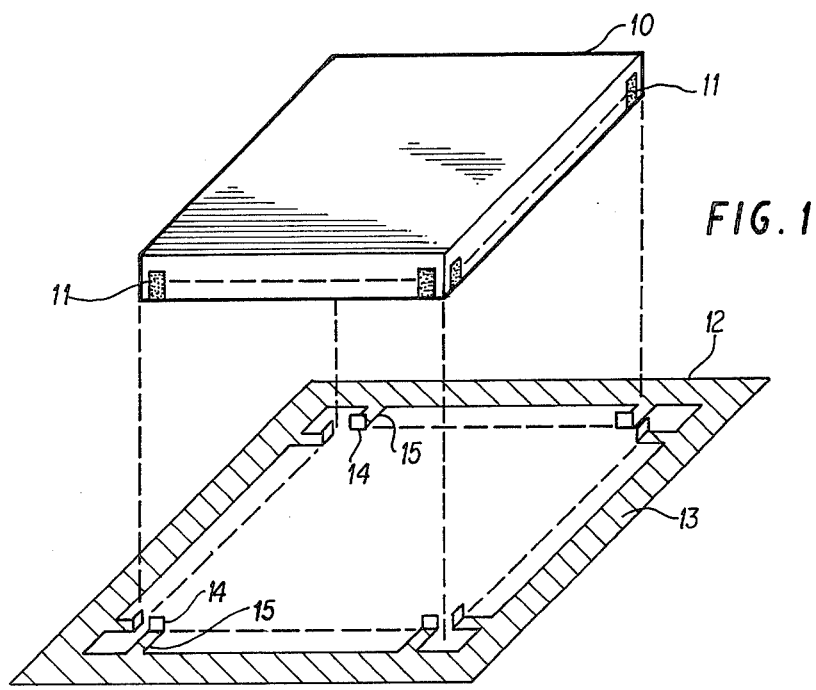
FIG. 1 is a perspective view of an LSI or VLSI IC package, without the leads attached, and a lead frame, and is presented to illustrate the inherent misalignment between the package and the leads of an LSI or VLSI IC package.

FIG. 1 is a perspective view of an LSI or VLSI IC package 10, without the leads attached, and a lead frame 12. The figure is presented to illustrate the misalignment between the IC package and the leads that is inherent in LSI and VLSI IC packages. The IC package 10 has a multiplicity of metal pads 11 formed around all four of its sides (only those at the corners are shown.) The lead frame 12 is formed from a single sheet of appropriate metal by an etching process. As explained previously, the pattern used in the etching process can be made very accurately by means of an automated photo-plotter. The leads formed as a result of the etching are thus precisely positioned with respect to each other. After the etching, the lead frame includes of a plurality of flat fingers 15 held in fixed position with respect to each other by the "keeper" 13. (Again, only those fingers at the corners of the "keeper" are shown.) Tooling is then used to bend the ends of the leads 15 at a right angle such that every lead 15 has an upwardly protruding tab 14 at its end. The rectangular outline formed by the tabs 14 is slightly larger than the outline of the IC package 10.

During assembly, the IC package 10 is placed within the opening provided by the tabs 14 and the tabs are attached to the metal pads 11 by a suitable bonding process, such as welding, brazing, soldering, etc. Unfortunately, during this assembly process, the package 10 is not precisely fixed with respect to the lead frame 12.

Thus, for a number of IC packages, the position of the leads 15 with respect to the corners of the IC package 10 varies as much as 0.010 inch. After the tabs 14 are attached to the pads 11, the keeper 13 is sheared from the leads 15.

Other types of lead frame-package combinations exist in the art but they also suffer the same disadvantage. That is, the leads are not precisely located with respect to the package when they are attached to the package.

Figure 2:
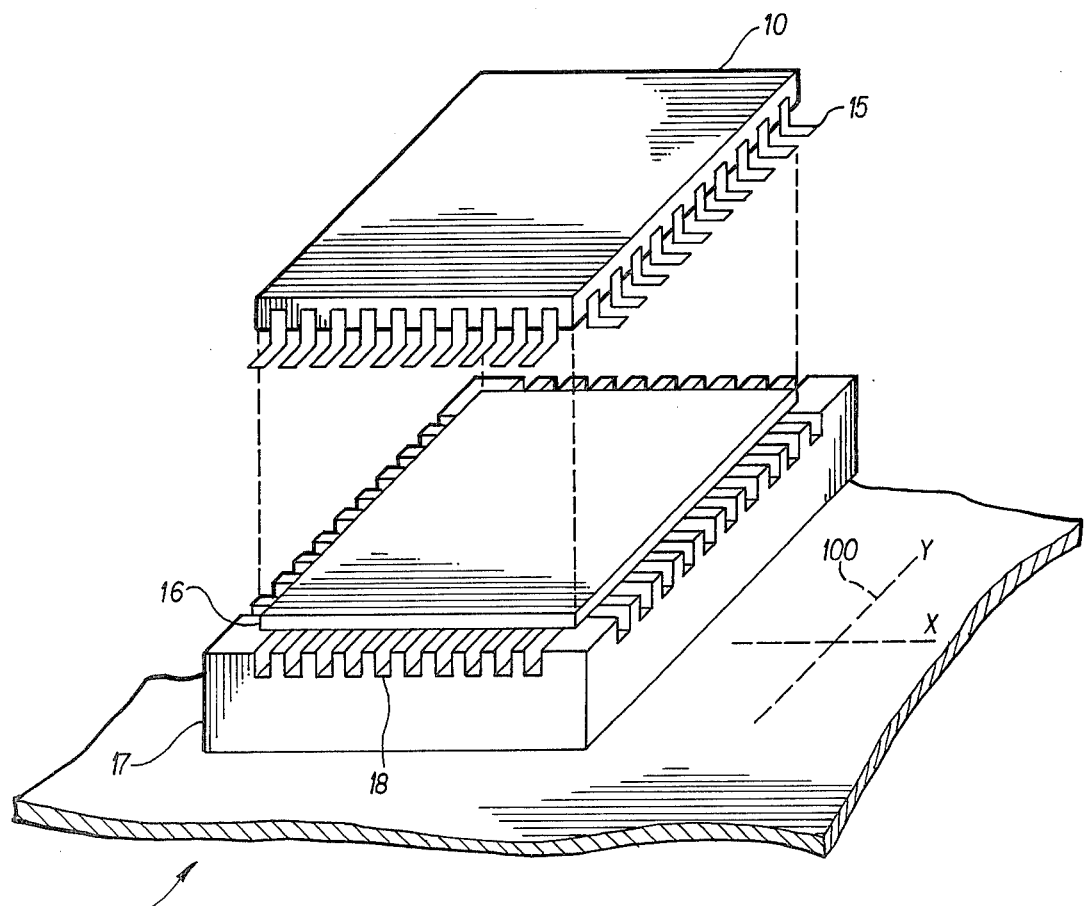
FIG. 2 is a perspective view of a portion of the alignment fixture of the present invention, and depicts a coarse alignment pedestal and the fine alignment block and their relationship to an LSI or VLSI IC package.

FIG. 2 is a perspective view showing a portion of an alignment fixture 19 to which a coarse alignment pedestal 16 and a fine alignment block 17 are attached. Also shown in FIG. 2 is an IC package 10. (For simplicity, only ten leads per side of the IC package are shown in the figure. In practice, as many as 64 leads per side may be present.) The coarse alignment pedestal 16 has the same cross sectional shape as the IC package 10 but is slightly smaller. As can be seen in the figure, the leads 15 protrude a small amount below the bottom surface of the IC package 10. When the IC package 10 is first placed on the coarse alignment pedestal 16, thereby causing the vertical portions of the leads 15 to fit around the coarse alignment pedestal 16. This action causes a coarse alignment of the leads with respect to the alignment fixture 19.

The fine alignment block 17 has a multiplicity of slots 18 machined in its surface. The slots are formed in the same pattern as that of the leads 15. The slots 18 are at least as long as the leads 15 and have a width slightly greater than that of the leads 15, e.g., 0.001 inch wider. When coarse alignment has been achieved, the package 10 can be moved slightly, if necessary, by an operator or other means to cause all the leads 15 to fit into their corresponding slot 18.

Machining techniques are available which allow the slots 18 to be positioned with respect to each other as accurately as the leads 15 are positioned by their etching process. Also, the leads 15 fit into the slots 18 along all four sides of the fine alignment block 18 and the slots are as long as the leads 15. The fine alignment block 17 is precisely aligned with the coordinate system 100 of the alignment fixture 19. These factors virtually eliminate any rotation of the leads 15 with respect to the alignment fixture 19. Thus, the fine alignment block 18 precisely positions the leads 15 with respect to the coordinate system 100 of the alignment fixture 19.

Figure 3:
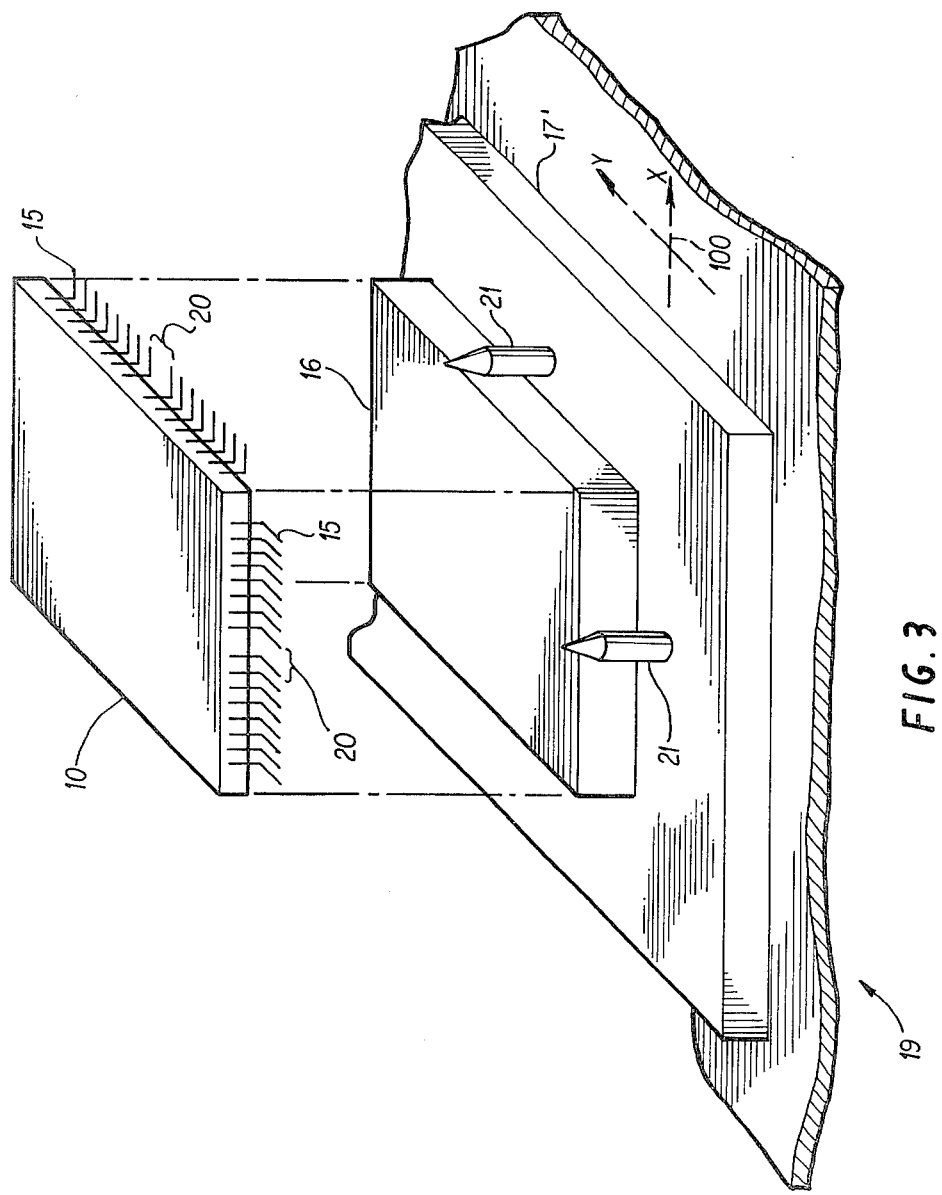
FIG. 3 is a perspective view of a second embodiment of a coarse alignment pedestal and a fine alignment block.

FIG. 3 is a perspective view illustrating a second embodiment of the fine and coarse alignment blocks that could be used with the alignment fixture 19. In this embodiment, tapered alignment pins are used on a fine alignment block 17' in place of the slots. The IC package which would be used with this embodiment has a alignment gap 20 between the leads 15 on each side of the IC package 10. The fine alignment block 17' has four tapered pins 21. The pins 21 are a larger diameter than the width of the gap 20 and are positioned with their centers on the same relative position as the centers of the alignment gaps.

After coarse alignment, as explained above, the tapered ends of the pins extend into the gaps 20. As the IC package 10 is lowered further onto the alignment fixture 19, the pins 15 on either side of the gaps 20 will align themselves on the tapered ends of the pins 21. This occurs on all four sides of the package 10 and precisely locates all of the leads 15 with respect to the reference coordinate system 100 of the alignment fixture 19.

Other embodiments which use alignment pins on the fine alignment block exist for IC packages which do not have the gap in each row of leads. In those cases, two pins are used on each side of the IC package. The pins are arranged so that the tapered ends will contact the outside edges of the outside leads on each side of the package. As the package is placed on the alignment fixture; the leads at each end of the package are aligned with the tapered end of the pin at that end of the package.

Figure 4:
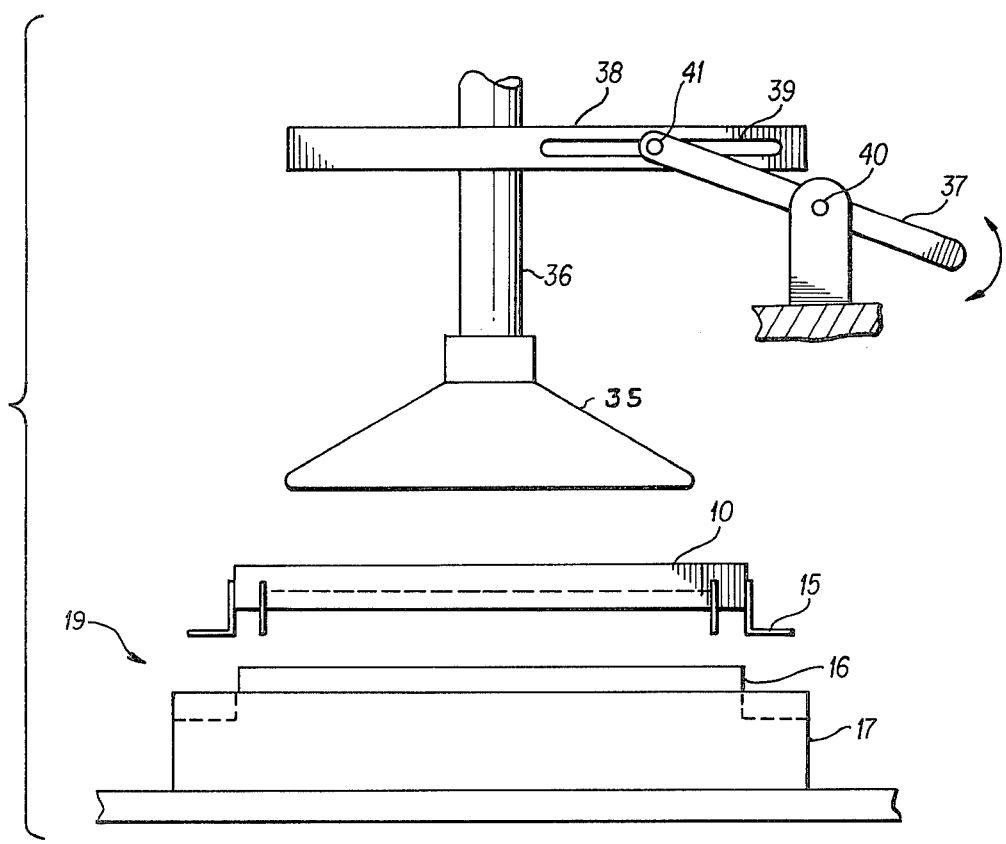
FIG. 4 is a mechanical schematic drawing that illustrates a simple vacuum chuck mechanism that could be used to lift the aligned package from the alignment fixture.

FIG. 4 schematically depicts a mechanism that could be used to lift the aligned IC package off of the fine alignment block 17. As described above, IC package 10 if first placed on the coarse and fine alignment blocks 16 and 17 (or 17') to align the leads 15 with respect to the reference coordinate system of the alignment fixture 19. A vacuum chuck 35, which is connected to a source of low pressure (not shown in the figure) by the tube 36, (the use of vacuum chucks to hold objects is well understood in the art and need not be explained here), can be selectively raised and lowered by the simple mechanical mechanism 37–41. The lever 37 pivots about the pivot point 40. When the lever 37 is depressed, the support arm 38 moves upward as the pin 41 moves to the right in the slot 39. The support arm 38 is attached to the tube 36. Thus, the vacuum chuck 35 is raised by lowering the support arm 38. Conversely, the vacuum chuck 35 is lowered when the lever arm 37 is raised. The mechanism 37–41 is shown only for illustrative purposes. Any suitable mechanism other than the one shown could be used to raise and lower the vacuum chuck.

When the leads of the IC package 10 are aligned on the fine alignment block 17, the vacuum chuck 35 is lowered until it contacts the top surface of the IC package 10. The low pressure used is enough for the vacuum chuck to hold the weight of the IC package 10, but not enough to cause the vacuum chuck to "suck" the package off of the fine alignment block 17, which action would disturb the lead alignment, as the chuck is lowered. Thus, when the vacuum chuck is raised, the IC package 10 is lifted off of the fine alignment block 17 with the leads 15 held in their aligned position.

Figure 5:
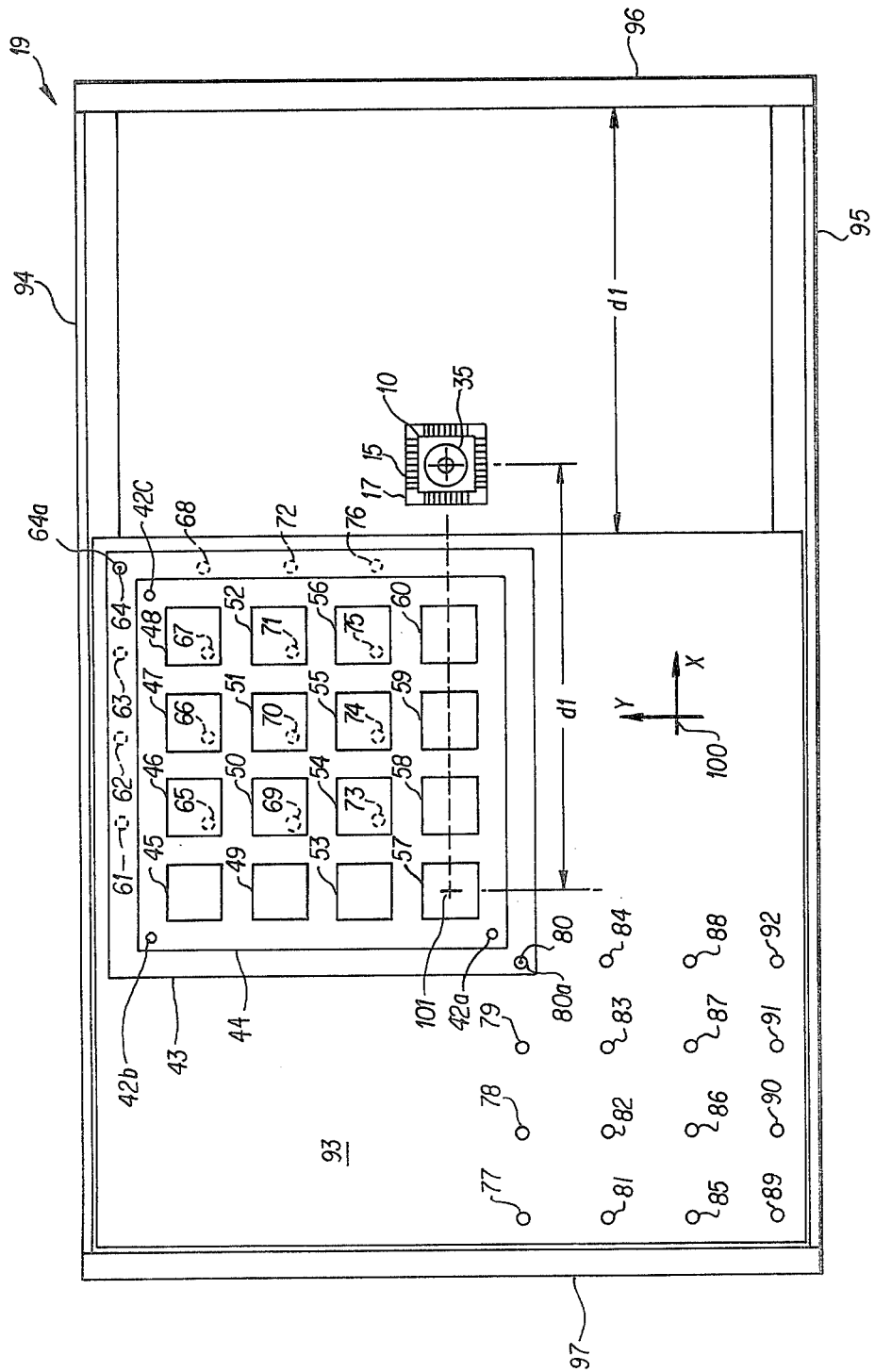
FIG. 5 is a plan view of the alignment fixture of the present invention, including a simple X-Y positioning table that is used to position the printed circuit board under the aligned IC package.

FIG. 5 is a plan view of one embodiment of the alignment fixture 19, including a simple X-Y positioning table that can be used to position a printed circuit board 44 under the aligned IC package. The printed circuit board 44 is held in a frame 43. Precisely drilled tooling holes 42a–42c, drilled during the fabrication of the printed circuit board 44, are placed on alignment pins (not shown in the figure) to align the board 44 in the frame 43. The frame 43 is free to move about on the plate 93 which can move in the X direction of the alignment fixture's coordinate system 100 along rails 94–95.

The printed circuit board 44 has an array of IC package locations which are represented in the figure by the sixteen squares 45–60. Each of the sixteen locations has a set of pads (for clarity, the pads are not shown in the figure) to which an IC package will be soldered.

In order to selectively allow the printed circuit board 44 and frame 43 to move in both the X and Y directions—or, more precisely, in order to selectively position one of the IC package locations 45–60 under the vacuum chuck 35—the plate 93 has two arrays of precisely drilled holes. Each array consists of sixteen holes, 61–76 and 77–92. The frame 43 has two precisely located holes 64a and 80a. As shown in the figure, the holes 64a and 80a of the frame 43 are over the holes 64 and 80, respectively, of the plate 93. Tooling pins (not shown in the figure) are placed through the holes 64a and 80a and through the holes 64 and 80, respectively, to hold the frame 43 in the position shown; which position, as described below, will allow the IC package 10 to be mounted at location 57. By selectively moving the holes 64a and 80a over the other holes within the sets 61–76 and 77–92, other IC locations can be manuevered to receive the IC package for mounting.

The chip package 10 with its leads 15 in the finely aligned position is held by the vacuum chuck 35 in a position above the level of the printed circuit board 44 (for clarity, the support structure of the vacuum chuck is not shown) while the fine alignment block 17 is below the level of the printed circuit board.

As shown in the figure, the center of the IC package location 57 is centered on the cross 100 and is aligned in the Y direction with the center of the vertical row of leads 15 and is a distance dl away in the X direction from the center of the horizontal row of leads 15. This is a result of locating the fine alignment block and vacuum chuck precisely with respect to the X-Y table, i.e., of aligning the fine alignment block 17 with the fixture's coordinate system 100. As also can be seen in the figure, the plate 93 can be moved a distance dl before encountering the end stop 96.

To solder an IC package in location 57, the package would be aligned, as described above, and the plate 93 lifted above the level of the printed circuit board with the vacuum chuck 35 would be moved to the end stop 96. The vacuum chuck 35 would then be lowered to place the aligned leads 15 on the corresponding pads of the printed circuit board 44, the vacuum chuck 35 would hold the IC package 10 while the automated or semi-automated soldering or other bonding process takes place to bond each lead to its respective pad.

When the bonding is complete, the vacuum chuck 35 would be raised, and the plate 93 would be moved to the left until it encounters the left end stop 97. As mentioned previously, the low pressure used is just sufficient to hold the weight of the IC package. Therefore, the vacuum chuck can be "pulled" off the package without causing any damage to the package or the newly bonded leads.

As referenced above, the two arrays of holes 61–76 and 77–92 in the plate 93, along with the two holes 64a and 80a in the frame 43 allow any of the IC package locations 45–60 to be centered on the cross 101 in preparation for soldering an IC package. For example, IC location 51 could be centered on the cross 100 by removing the tooling pins from the holes 64a and 80a, sliding the frame 43 until the holes 64a and 80a are aligned with holes 70 and 86, respectively, of the plate 93, and re-inserting the tooling pins.

The X-Y table described above is a simple mechanical type of positioning mechanism and has obvious limits on its accuracy due to mechanical tolerances. If greater locating precision is required, the mechanism described can be replaced with a more accurate positioning table, such as the type used in a photo plotter or an electron beam system. X-Y positioning tables are available which, using laser interferometers for position feedback, can be positioned to an accuracy on the order of 0.1 micron. The type X-Y positioning table used does not affect the operation of the invention as long as its accuracy is sufficient for the application.

As thus described, the invention, through the use of the coarse alignment pedestal, the fine block, the vacuum chuck, the associated raising and lowering mechanism, and the X-Y positioning table aligns the leads of an IC package with the pads of the printed circuit board and holds the package while the leads are soldered in place.

What is claimed is:

1. In a manufacturing assembly process wherein an integrated circuit (IC) package with a multiplicity of precisely placed leads must have said leads aligned with respect to a corresponding set of precisely placed pads on a printed circuit board prior to the bonding of said leads to said pads, and where said leads are accurately fixed in position with respect to each other but are not accurately fixed with respect to said IC package, an apparatus for aligning said leads with respect to said pads, and maintaining said alignment while said leads are bonded to said pads, said apparatus comprising:
   coarse alignment means for coarsly aligning said leads with respect to a known coordinate system;
   fine alignment means for precisely aligning said leads after said leads are first coarsely aligned therewith through the use of said coarse alignment means;
   mounting means for mounting said printed circuit board so that said pads are aligned with said coordinate system; and
   positioning means for positioning the pads of said printed circuit board and the leads of said aligned IC package such that said aligned leads make contact with said corresponding pads, and for maintaining this aligned position while said leads are bonded to said pads.

2. The apparatus of claim 1 wherein said positioning means comprises:
   raising means for removing said IC package from said fine alignment means while still maintaining said leads in the desired aligned position;
   sliding means for sliding said mounted printed circuit board underneath said lifted IC while still keeping said pads aligned with the coordinate system; and
   lowering means for lowering said IC package down to said board, while still maintaining the leads thereof in the desired aligned position, whereby each of said leads contacts its respective pad on said board and may be bonded thereto.

3. The apparatus of claim 2 wherein said coordinate system is an orthogonal coordinate system having X and Y axes, and wherein said sliding means allows said printed circuit board to slide in the X direction, and further wherein said mounting means comprises
   a frame to which the printed circuit board is mounted; and
   selectable attachment means for allowing said frame to be attached to the sliding means at any of a plurality of discrete locations along the Y axis of said coordinate system.

4. The apparatus of claim 3 wherein said sliding means includes stop means for limiting the travel of said printed circuit board in said X direction to a maximum position, said maximum position representing a known position with respect to said coordinate system at which the lowering means may lower the IC package to a mounting location on said board; and further wherein said selectable attachment means selectively allows said frame to be attached to the sliding means at any of a plurality of discrete locations along the X axis of said coordinate system; whereby any of a plurality of locations on said board adapted to have IC packages mounted thereto may become said mounting location when said board is slid to its maximum position.

5. The apparatus of claim 2 wherein said raising means and lowering means comprise a vacuum chuck adapted to attach to the top of said IC package;

means for raising and lowering said vacuum chuck.

6. An apparatus for aligning and mounting an LSI or VSLI integrated circuit (IC) chip to a printed circuit board, said LSI or VLSI chip being housed in a package having at least 64 leads protruding therefrom, said printed circuit board having respective pads to which said leads are to be bonded, said leads and said pads being accurately spaced with respect to each other, said apparatus comprising:

lead alignment means for precisely aligning the leads of said chip with respect to a reference coordinate system of said apparatus at a first station thereof;

pad alignment means for aligning the pads of said board with respect to said coordinate system at a second station of said apparatus;

positioning/holding means for moving said leads and said pads, while still maintaining the desired alignments with said reference coordinate system to a third station of said apparatus, contacting each of said leads with a respective pad at said third station, and maintaining this contact until the leads of the chip may be bonded to their respective pads.

7. In a manufacturing assembly process wherein an integrated circuit (IC) package with a multiplicity of precisely placed leads must have said leads aligned with respect to a corresponding set of precisely placed pads on a printed circuit board prior to the bonding of said leads and where said leads are accurately fixed in position with respect to each other but are not accurately fixed with respect to said IC package, a process for aligning said leads with respect to said pads comprising the steps of:

(a) performing a coarse alignment of said leads by aligning said package with respect to a known reference;

(b) performing a fine alignment of said leads; with respect to said known reference;

(c) holding and lifting said package so that said leads remain in said fine aligned position;

(d) mounting said printed circuit board so that said pads are slidably aligned with said known reference;

(e) sliding said printed circuit board underneath said package until said pads are below said leads;

(f) lowering said package, while still maintaining the leads in the desired aligned position, until said leads contact said pads;

(g) holding said leads against said pads; and (h) bonding said leads to said pads.

* * * * *